US005673388A

United States Patent [19]
Murthi et al.

[11] Patent Number: 5,673,388
[45] Date of Patent: Sep. 30, 1997

[54] MEMORY TESTING IN A MULTIPLE PROCESSOR COMPUTER SYSTEM

[75] Inventors: Raghu Murthi; Scott Tetrick, both of Portland, Oreg.

[73] Assignee: Intel Corporation, Santa Clara, Calif.

[21] Appl. No.: 679,186

[22] Filed: Jul. 12, 1996

Related U.S. Application Data

[63] Continuation of Ser. No. 414,367, Mar. 31, 1995, abandoned.

[51] Int. Cl.⁶ .................................................. G06F 11/34
[52] U.S. Cl. ............................. 395/183.18; 395/184.01
[58] Field of Search .................... 355/183.01, 183.12, 355/183.18, 726, 727; 364/265.3, 228.1

[56] References Cited

U.S. PATENT DOCUMENTS

| | | | |
|---|---|---|---|
| 4,873,705 | 10/1989 | Johnson | 371/21.2 |
| 4,914,570 | 4/1990 | Peacock | 364/200 |
| 5,109,382 | 4/1992 | Fukunaka | 371/21.1 |
| 5,127,092 | 6/1992 | Gupta et al. | 364/931.4 |
| 5,136,714 | 8/1992 | Braudaway et al. | 364/200 |
| 5,230,045 | 7/1993 | Sindhu | 395/425 |
| 5,269,013 | 12/1993 | Abramson et al. | 364/200 |
| 5,274,648 | 12/1993 | Eikill et al. | 371/21.2 |
| 5,289,588 | 2/1994 | Song et al. | 395/425 |
| 5,299,202 | 3/1994 | Vaillanacourt | 371/11.1 |
| 5,408,629 | 4/1995 | Tsuchiya et al. | 395/425 |
| 5,410,654 | 4/1995 | Foster et al. | 395/726 |
| 5,423,044 | 6/1995 | Sutton et al. | 395/725 |

FOREIGN PATENT DOCUMENTS 067990  3/1994  Japan .................. G06F 11/22

OTHER PUBLICATIONS

Sung "Testing Shared–Memory Parallel Programs" IEEE 1988 pp. 559–566.
Atkins "Efficient Shared Memory for Testing Parallel Algorithms on Distributed Systems" IEEE 1989 pp. 13–15.
Prosise, Jeff, *PC Magazine*, Tutor, column; Ziff–Davis Publishing Co., vol. 9; No. 3, p. 327.

*Primary Examiner*—Robert W. Beausoliel, Jr.
*Assistant Examiner*—Albert Décady
*Attorney, Agent, or Firm*—Blakely, Sokoloff, Taylor & Zafman

[57] ABSTRACT

Testing of shared memory (RAM) in a multiple processor computer system is achieved by partitioning the memory and allocating the memory portions to respective processors in the system. Each processor performs testing of its allocated memory portion simultaneously with the other processors in order to reduce the time required to complete the memory test.

18 Claims, 4 Drawing Sheets

MEMORY TESTING IN A MULTIPLE PROCESSOR COMPUTER SYSTEM

This is a continuation of application Ser. No. 08/414,367, filed Mar. 31, 1995, now abandoned.

BACKGROUND OF THE INVENTION

1. Field of the Invention

This invention relates to the testing of memory in a computer system in which main memory is shared between multiple processors.

2. Art Background

Computer systems in general comprise at least one processor (CPU) coupled by way of a bus to main memory and an I/O system which allows communication with, for example, a keyboard, display, floppy disk and hard disk apparatus. When the computer system is powered on or otherwise emerges from a reset condition, a number of initialization tests and configuration procedures are ordinarily carried out. The system initialization process is a sequence of events which are carried out after reset and before an operating system (OS) is brought up. After reset, a processor in the computer system begins execution of code which is often referred to as the initialization software. This initialization software is commonly executed from the system ROM (read only memory), which has been previously programmed and tested. The initialization software operations performed by the processor test and initialize the various components of the system which are necessary for execution of the operating system, such as the processor itself, the main memory, I/O components such as the keyboard and display, and the hard disk from which the operating system will be loaded.

In a multiprocessor computer system where several processor reside on the same system bus, one of the first initialization process steps which is performed is to select one of the processors, called the bootstrap processor (BSP), to oversee the initialization and perform the bulk of the initialization test and configuration procedures. The BSP may be a fixed one of the multiple processors in the system, or can be selected dynamically from amongst the processors at each initialization to prevent a single faulty processor from impeding initialization of the entire system. Once the BSP has been selected it carries out tests including verifying its own operation and testing the system memory and I/O components required to bring up the operating system. Thereafter, the remaining processors are allowed to execute code to verify their functionality under control of the BSP.

As mentioned, a single one of the multiple processors has traditionally being used to perform most of the initialization procedures, with the remainder of the processors being tested as one of the final steps before passing control to the operating system. In this respect, the initialization of multiple processor systems in the past has been similar to that of single processor computer systems, with merely a series of operations added to the end in order to initialize the additional processors. Multiple processor systems have generally conformed to this type of initialization since they have often evolved from single processor system architectures and/or can often operate themselves as single processor systems in some circumstances.

Increasingly, the main memory storage capacity provided in computer systems, particularly multiple processor computer systems, is significantly larger than has been required in the past, in order to cope with the demands of increased software and data complexity. One of the tasks of the initialization process is to test the main memory of the computer system to ensure its functionality so that data is not lost during operations. This memory testing often entitles writing to and reading from every storage location in the memory, which can take a significant amount of time with a large capacity main memory. In some applications, multiple processor computer systems are required to be operational substantially continuously, and in such cases the time taken for memory testing following system reset can be particularly significant.

It is therefore desired to provide a faster way of initializing a multiple processor computer system, and in particular of increasing the speed of memory testing in the multiple processor system. The way in which an increase in memory testing speed is achieved, in accordance with the present invention, is by exploiting a characteristic of multiple processor computer architectures wherein the data transfer bandwidth between the main memory and the system bus is greater than the bandwidth between the individual processors and the system bus. Thus, by employing a plurality of the processors in a multiprocessing computer system to perform testing of the memory thereof, a decreased memory testing required time can be achieved since a greater amount of the memory bus bandwidth can be utilized as compared with an initialization procedure in which a single processor is used for memory testing.

SUMMARY OF THE INVENTION

Accordingly, the present invention provides an initialization method, for use in a multiple processor shared memory computer system, comprising the steps of: allocating to each of a plurality of processors in the computer system a respective portion of the shared memory; and testing the shared memory by simultaneously operating the plurality of processors so as to perform memory testing on their respective shared memory portions.

Preferably the initialization method includes initializing one of the plurality of processors as a bootstrap processor, which is utilized to determine the amount of memory which is to be tested and the number of processors present in the computer system and for allocating the respective portions of memory to the processors. The bootstrap processor can also be used to test and/or initialize other essential resources in the computer system, such as a memory controller. According to one aspect of the invention, the bootstrap processor assigns each of the other processors in the computer system a respective processor number, and communicates the processor number to the respective processors together with data representing the determined amount of memory and the total number of processors present in the computer system, so as to enable each of the other processors to determine a respective starting address and ending address defining the respective portion of shared memory to be tested by that processor.

In a preferred form of the invention, the bootstrap processor passes data to each of the other processors in succession, said data enabling each of the other processors to successively begin testing of their respective shared memory portions, before the bootstrap processor begins testing its own allocated memory portion. Each of the plurality of processors then sets a flag in a mutually accessible register at the conclusion of testing of its respective memory portion, which enables the bootstrap processor to determine whether all processors have concluded memory testing by examining whether all flags have been set in the register.

The invention also provides a method for initializing a computer system having a plurality of processors which share memory on a common bus, comprising: determining the size of the shared memory; allocating to each of the plurality of processors a respective portion of the shared memory; and performing a memory test of the shared memory by simultaneous operation of the plurality of processors such that each processor tests its respective allocated portion of the shared memory.

Writing to and reading from the shared memory may be controlled by a memory controller of the computer system, wherein the simultaneous memory testing operations performed by the plurality of processes involves a form of time division multiplexed communication between the plurality of processors and the memory controller. Preferably each of the plurality of processors communicates with the memory controller, in the above mentioned time division multiplexed manner, in order to effect writing to and subsequent reading from each memory location of its respective allocated portion of the shared memory.

In accordance with the present invention there is also provided a computer system comprising: a plurality of processors coupled to a bus; volatile memory coupled to the bus; and stored program instructions, for execution by the processors, for testing the volatile memory by simultaneously testing a plurality of portions of the memory under control of respective said processors. It is preferred that the computer system include a memory controller for controlling writing to and reading from the volatile memory, wherein the simultaneous testing of the plurality of portions of the memory includes passing time division multiplexed signals between the plurality of processors and the memory controller to effect said writing to and reading from the respective memory portions.

In another form the invention provides a computer system comprising: a plurality of processors coupled to a bus; memory means, coupled to said bus, and containing a plurality of individually addressable portions; a memory controller means for writing to and reading from said memory means; and a non-volatile memory means containing initialization instructions, for execution by the plurality of processors, such that each processor of the plurality of processors communicates with the memory controller means so as to test a respective separate said portion of the memory means.

According to the present invention there is further provided a method for testing memory in a multiple processor computer system having shared memory accessible on a common bus, comprising the steps of: assigning to each of a plurality of processors a respective separate portion of commonly accessible memory; for each of the plurality of processors, writing data to and subsequently reading data from at least substantially every memory address of said respective separate portion of memory, the writing and reading of said data being time division multiplexed as between the plurality of processors; and for each said memory address written to and read from by said respective processor, comparing in said respective processor said data written and said data read therefrom.

BRIEF DESCRIPTION OF THE DRAWINGS

The invention is described in greater detailed herein after, by way of example only, with reference to the accompanying drawings, wherein.

DETAILED DESCRIPTION OF THE INVENTION

Figure 1:
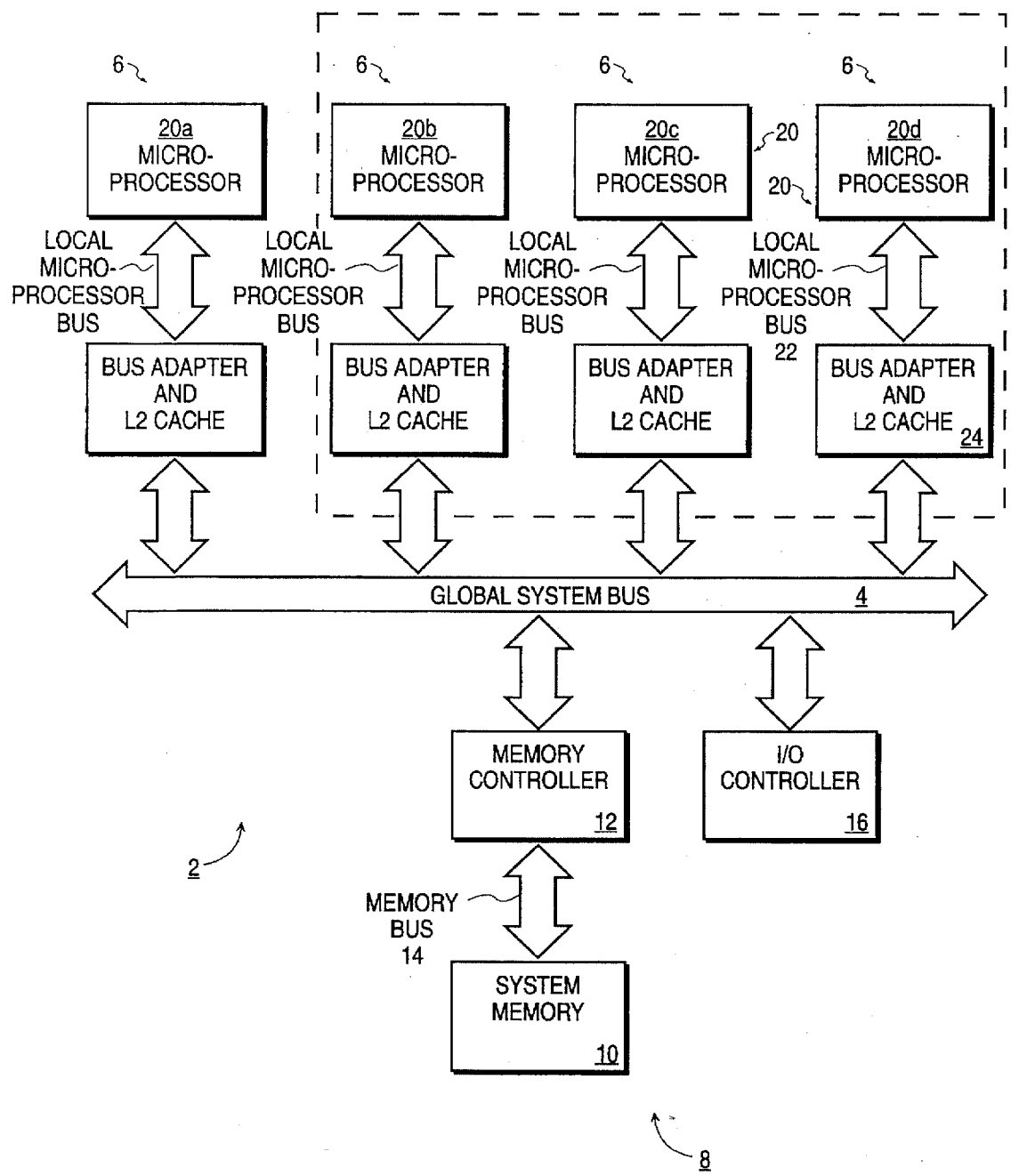
FIG. 1 is a block diagram of a multiple processor computer system.

A method and computer system for the testing of memory shared between a plurality of processors in a multiple processor computer architecture is described hereinbelow. In the following description, numerous specific details are set forth such as examples of processor architectures, and specific procedural steps for initialization of an exemplary multiprocessor shared memory system, etc. in order to provide a thorough understanding of the present invention. It will be evident, however, to those skilled in the art that these specific details need not be used to practice the present invention. In other instances, well known procedures and circuits have not been shown or described in detail in order to avoid unnecessarily obscuring the present invention.

The method and apparatus of the preferred embodiment of the invention are typically embodied in a computer system in which multiple microprocessors are coupled to a shared system memory (RAM) by way of a global system bus. An example of a multiprocessor computer system 2 is shown in block diagram form in FIG. 1. The computer system 2 comprises a plurality of microprocessor subsystems 6, a memory subsystem 8 and I/O interface 16, all of which communicate by way of a global system bus 4. Each of the microprocessor subsystems 6 comprises a microprocessor 20 which communicates with a bus adapter and level-two cache 24 by way of a local microprocessor bus 22. The microprocessor 20 can be any microprocessor which is suitable for use in a multiprocessing environment, such as an Intel i486 brand microprocessor or Pentium™ brand microprocessor. Control, address and data signals are coupled from the microprocessor 20, by way of the local microprocessor bus 22, to the bus adapter and cache circuitry 24 in each microprocessor subsystem 6. The function of the circuitry 24 is to interface the microprocessor 20 to the global system bus 4, including ensuring that the global system bus signal protocols are met for signals issued from the microprocessor 20 on the local bus 22. Additionally, a level-two cache can be provided in the interface circuitry 24 in order to buffer data access from the memory subsystem 8 during normal operation of the computer system 2. In general, for the purposes of memory testing, the level-two caches in the microprocessor subsystems 6 are disabled.

The input/output controller 16 is utilized to interface the global system bus 4 of computer system 2 to components such as disk drives, a keyboard, a display and the like. For example, the I/O controller 16 can couple a hard disk drive (not shown) to the computer system 2 from which an operating system can be loaded following completion of the initialization process of the computer system.

The memory subsystem 8 contains shared random access (RAM) system memory 10 for use by the microprocessor subsystems 6. The system memory 10 is coupled to a memory controller 12 by way of a memory bus 14. The memory controller 12 interfaces the system memory 10 to the global system bus 4, to enable data to be retrieved from system memory and placed 20 on the global bus 4, and for data on the global bus to be stored in the system memory.

Also residing on the global system bus 4 (but now shown in FIG. 1), or on each of the local microprocessor buses 22, is system ROM (read only memory) which is preprogrammed with instructions to be executed by the microprocessors 20 for initializing the computer system 2 after reset. The initialization instruction software can form part of a basic input/output system (BIOS) for the computer system. Non-volatile read/write memory may also be provided in order to store configuration information for use in the initialization process, which can be updated from one initialization to the next.

A conventional initialization process in a multiprocessor computer system can be viewed in three phases. In the first phase, the system is initialized as a uniprocessor computer, with one processor (the bootstrap processor, or BSP) initializing the system. All of the other processors are idle in this phase. The BSP executes code from the system ROM to initialize the shared system memory and the I/O devices required to bring up the operating system. In the second phase, the remaining processors are allowed to execute code to verify their functionality under the control of the BSP. The operating system is brought up in the third phase. One way in which a multiprocessor system may be so initialized is outlined in the steps set forth below.

1. Following a reset condition, all of the processors in the system execute code from the system ROM. They do a minimum amount of self testing and then perform an arbitration process to determine which processor will be the BSP. The remaining CPUs pause operation and are temporarily idle.
2. The BSP runs a self test in order to test the processor registers and basic processing functions. The BSP also tests and initializes the bus adapter circuitry for access to the global system bus, and the I/O controller.
3. The BSP accesses non-volatile configuration memory to locate a display device. If the configuration memory is invalid or if it does not contain information about the display device, a default device is chosen. The BSP then configures and initializes the display device (e.g. by way of I/O controller 16) so that error messages can be displayed if an error occurs during the initialization process.
4. The BSP initializes the main memory subsystem (8), including testing the registers and other testable features of the memory controller.
5. The BSP then determines the extent of main memory (10) available and performs a memory testing procedure to test each memory location for functionality.
6. If the BSP subsystem includes caches and/or interrupt controllers these are tested.
7. Configuration memory is consulted to locate a keyboard and hard disk that will be used to boot the operating system. The BSP selects default devices if the configuration non-volatile memory is invalid or does not contain information about these devices. The BSP initializes the keyboard and hard disk ( e.g. by way of I/O controller 16).
8. The BSP sets a flag indicating to the other microprocessors in the system that the essential system components have been tested and initialized, and then releases the other CPUs one by one with a reset interrupt. The BSP also sets a timer and goes into a busy wait loop and waits to be interrupted by either the other CPU if it is functional or by its own timer.
9. Each non-BSP, when out of reset, executes code from the system ROM and recognizes that the essential system components have already been tested by way of the flag set by the BSP. It then executes code to run a self test and to test its local caches, bus adapter and other local components. If it passes this testing, it then sends an interrupt to the BSP and busy waits to be awakened by the operating system boot code. The BSP determines whether each additional CPU is functional on the basis of whether the BSP was interrupted by the other processor or by its own timer interrupt. This sequence is repeated for each CPU in the system, and information about the number of operating processors in the system is stored in a fixed location in memory.
10. The BSP then determines the availability of any additional system resources and stores the system configuration information to the non-volatile configuration memory before passing control to the operating system boot code.

As it is apparent from the forgoing description of a conventional initialization process, testing of the shared system memory 10 is performed exclusively by the bootstrap processor (BSP), and the additional microprocessor subsystems 6 present in the computer system are initialized at the end of the process, immediately before passing control to the operating system. According to embodiments of the present invention, the initialization process for a multiple processor computer system is modified so as to enable testing of the system memory to the performed by the use of more than one microprocessor present in the computer system. An initialization process in accordance with an embodiment of the invention is described hereinafter with reference to the flow charts of FIGS. 2 and 3. The described initialization process concentrates on the issue of testing of the shared system memory 10, and where the initialization method steps are in common with the conventional method described above, the implementation of these steps are to be taken as being in accordance the conventional initialization procedure as is known to those of ordinary skill in the art.

Figure 2:
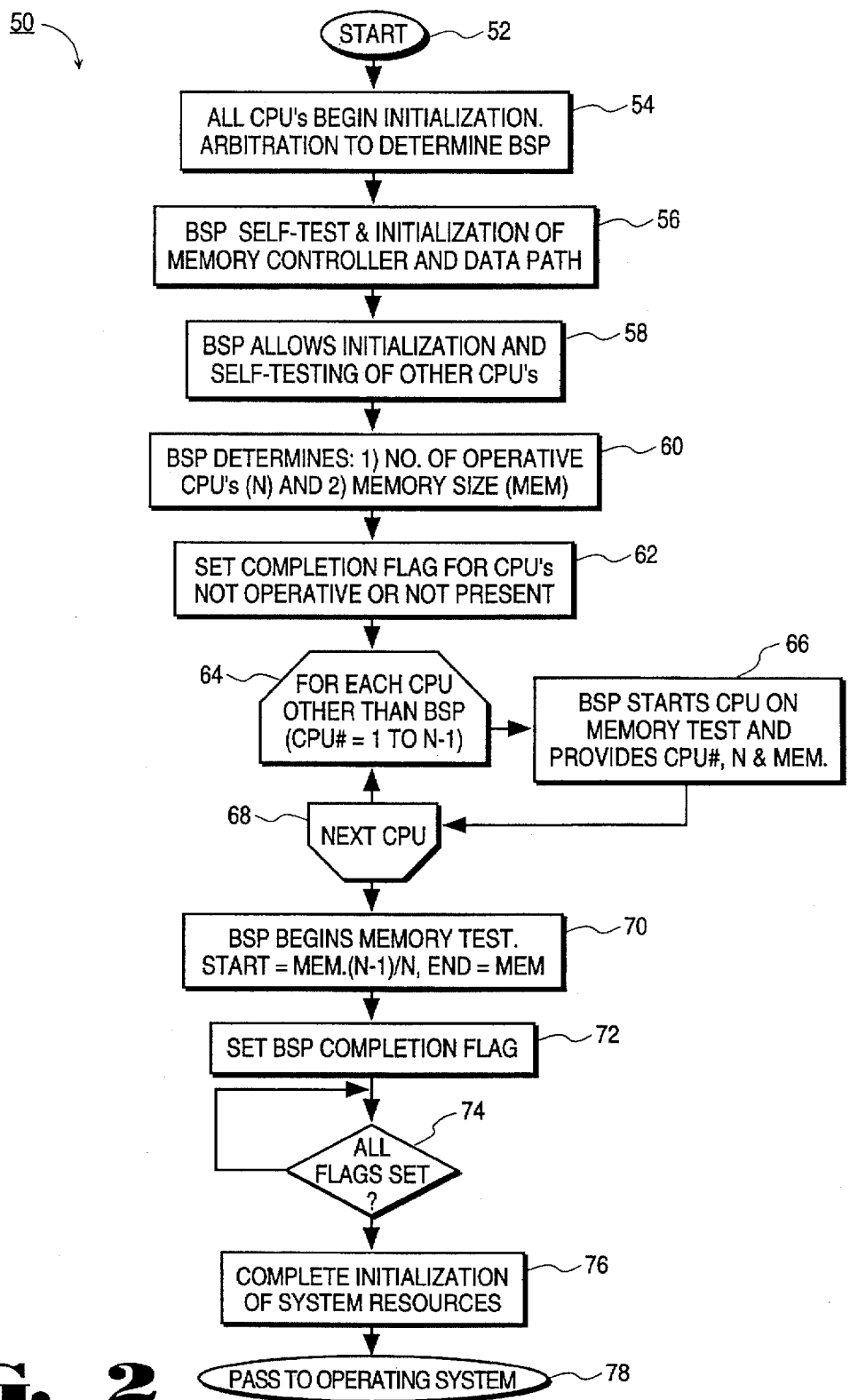
FIG. 2 is a flow chart illustrating a first portion of an initialization process.

Referring firstly to FIG. 2, there is shown a flow chart 50 of steps performed during initialization of a computer system such as the computer system 2 of FIG. 1. The procedure of flow chart 50 begins with step 52 wherein the computer system emerges from a reset state. There are ordinarily two possible reset conditions for the system, namely a cold start and a warm start. Cold start refers to the reset condition when the system's power is switched on or when a hardware reset is initiated by a user of the system. Warm start refers to the reset condition following a software reset instruction, which can occur in a variety of circumstances. In some instances the initialization procedure for a warm start may differ from the procedure carried out for a cold start, particularly with respect to the testing of shared memory, and thus for the purposes of the following description it will be assumed that the reset condition at step 52 arises from a cold start, such as power having been applied to the computer system 2.

Figure 3:
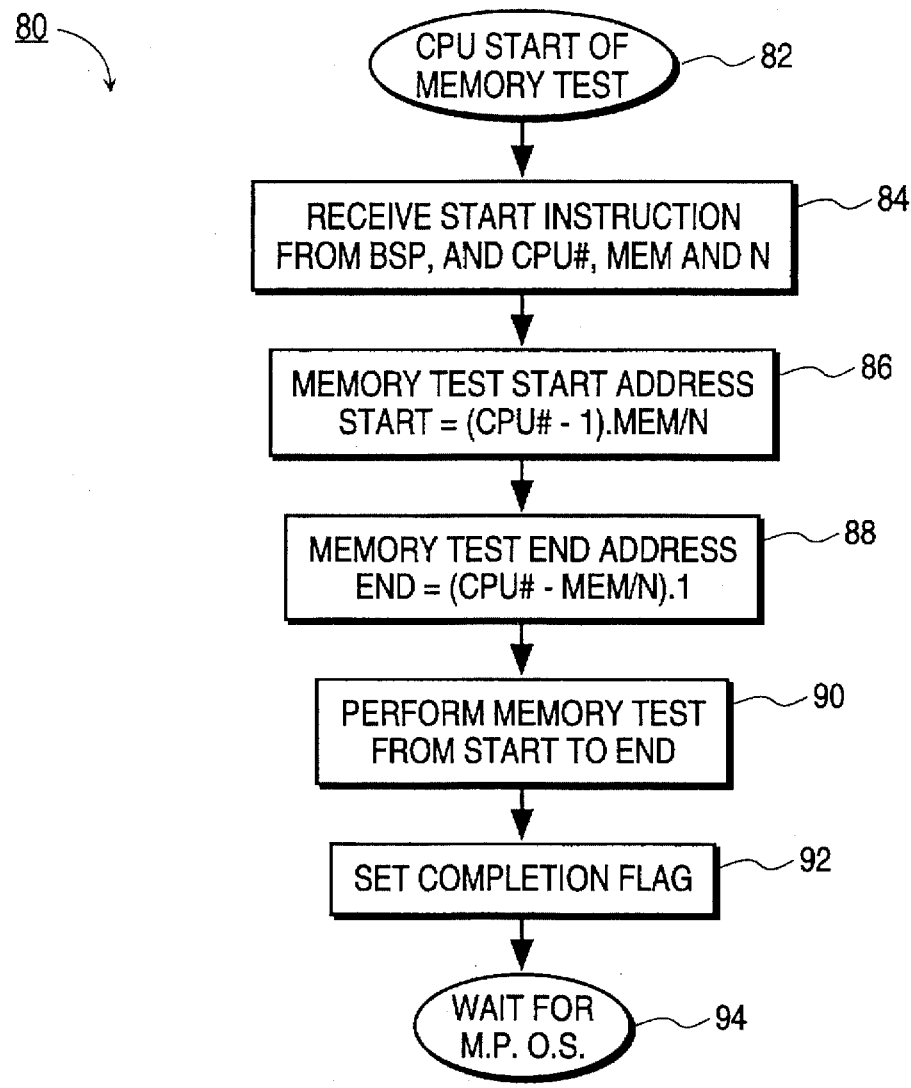
FIG. 3 is a flow chart illustrating a second portion of the initialization process.

As mentioned above, the computer system 2 includes system ROM (not shown in FIG. 1) which is accessible by the microprocessors 20A, 20B, 20C and 20D contained in the processor subsystems 6. The system ROM contains the instructions for the microprocessors 20 to carry out the procedure of flow chart 50, as well as the procedure of flow chart 80 which is illustrated in FIG. 3 and described hereinbelow.

When the computer system 2 emerges from the reset state, each of the microprocessors 20A, 20B, 20C and 20D begin initialization by executing code from the system ROM (step 54). An arbitration process ensues in order to determine which of the processors 20 will act as the bootstrap processor (BSP). The arbitration process may involve each of the processors attempting access to a mutually accessible flag or register. The first processor to gain access to the flag or register sets a particular value therein, and becomes the bootstrap processor. The processors which subsequently access the flag or register detect that a BSP has already been assigned, and execute a halt instruction and stop executing.

The allocation of the BSP by way of an arbitration process assumes that the processor subsystems 6 are essentially equivalent in their hardware configurations, so that each processor 20 operates in like manner when emerging from the reset state. Another way of assigning a bootstrap processor is to merely have one of the processors 20 permanently designated as the bootstrap processor, such as by virtue of being in a particular slot in the computer system architecture, in which case no arbitration process is required.

Assuming that microprocessor 20A is assigned as the BSP, this processor then proceeds to perform a series of self tests including testing and initializing the bus adapter for access to the global system bus 4. The BSP 20A then initializes the memory controller 12 so as to allow the memory controller to pass signals between the system memory 10 and memory bus 14 and the global system bus 4 (step 56). At step 58 the BSP releases the other processors (microprocessors 20B, 20C and 20D) one by one and allows the other processors to carry out a self testing procedure to establish their functionality.

Following the initialization and self testing of the other processors (step 58) the BSP is then able to determine the number of operative CPUs (N, where N=4 for the computer system shown in FIG. 1) at step 60. The BSP also probes the system memory 10, utilizing the memory controller 12, to determine the size of the system memory present (MEM).

In order to enable coordination of the memory testing between the various processors 20 a register is set up, for example in the memory controller 12, containing a flag for each processor in the computer system 2, whether or not that processor is in fact present in the system or, if present, operative. If a processor is not present or inoperative, the completion flag in the register is set at step 62, and the completion flag for each of the processors which will contribute to the memory testing phase of the initialization is reset. The BSP then allocates a sequence number for each of the operative processors, and for each processor other than the BSP provides the processor sequence number (CPU#), the total number of operative processors (N) and the memory size (MEM) and instructs that processor to begin memory testing (steps 64, 66, 68).

The memory testing procedure carried out by each processor other than the BSP (i.e. microprocessors 20B, 20C, 20D) is illustrated in flow chart 80 shown in FIG. 3, and it is described hereinbelow.

Referring to flow chart 80 in FIG. 3, each processor 20 other than the BSP (20A) begins its memory testing routine at step 82, whereupon it is aroused from its idle state upon instruction from the BSP. At step 84 the processor receives its allocated processor sequence number (CPU#), together with data indicative of the amount of shared memory present in the computer system (MEM) and the total number of operative processors present (N). This information is required by the processor to enable it to determine which portion of the shared memory in which to conduct its memory testing. The processor then proceeds to utilize the data forwarded from the BSP to calculate a start address for its memory test (step 86) and an end address for its memory test (step 88). Having calculated the start address and end address for the memory testing procedure, the processor then tests each memory location from start address to its end address, by communicating with the memory controller 12 to write data to and read data from this memory locations, as will be described in greater detail below. After completing the memory testing at step 90, the processor then sets the corresponding completion flag (step 92) and again enters into an idle state while waiting for the multiprocessing operating system to be booted (step 94).

Referring again to flow chart 50, once the BSP has started all of the other processors on the memory testing routine constituted by flow chart 80, the BSP then begins its own memory test (step 70). Thus, at step 70 in flow-chart 50, there is a period of time during which all of the processors including BSP are involved in testing of the shared system memory 10. When the BSP finishes testing its portion of shared memory it sets the completion flag (step 72) and loops until all of the completion flags have been set (step 74) indicating that every processor has finished memory testing. To finalize the initialization procedure, the BSP tests and initializes any further essential system resources, such as the hard disk from which the operating system will be loaded (step 76) and finally passes control to the operating system boot code at step 78.

As mentioned above, access to the system memory 10 by the microprocessors 20 in the computer system 2 are controlled through the memory controller 12. Briefly, a request for memory resources is made by a microprocessor 20, and if the memory location requested is not buffered in the level-two cache (which, as mentioned, is disabled for the purposes of the initialization memory test), a global system bus cycle is started. The global system bus cycle is detected by the memory controller 12, and converted into the appropriate memory bus command for memory bus 14, so as to access the memory location requested. If the memory request made by the microprocessor was to write data to memory, the memory controller 12 then signals on the global system bus when the command has been completed. If the request by the microprocessor was to retrieve data from system memory 10, the memory controller, at the completion of the request, places the data retrieved on the global system bus to be received by the requesting microprocessor.

A characteristic of a typical multiple processor architecture is that the global system bus and memory bus has a higher data transfer bandwidth than the individual local microprocessor buses, which enables it to support more than one microprocessor. Thus, during memory testing in accordance with the embodiment of the present invention, a greater amount of the global system bus and memory bus bandwidth is utilized than in the case where only a single processor is used for the memory testing procedure. In general, however, the increase in memory testing speed which can be achieved by embodiments of the invention is nevertheless limited by the memory bus and global system bus data transfer bandwidth. Requests for reading from or writing to the system memory from the microprocessors 20 to the memory controller 12 are arbitrated in accordance with the particular bus communication protocol established on the global system bus for the computer system 2. In general, where each of the microprocessors 20 have equal priority within the computer system 2, the communications between the memory controller 12 and the various microprocessors 20 will be effectively time division multiplexed amongst the microprocessors.

Figure 4:
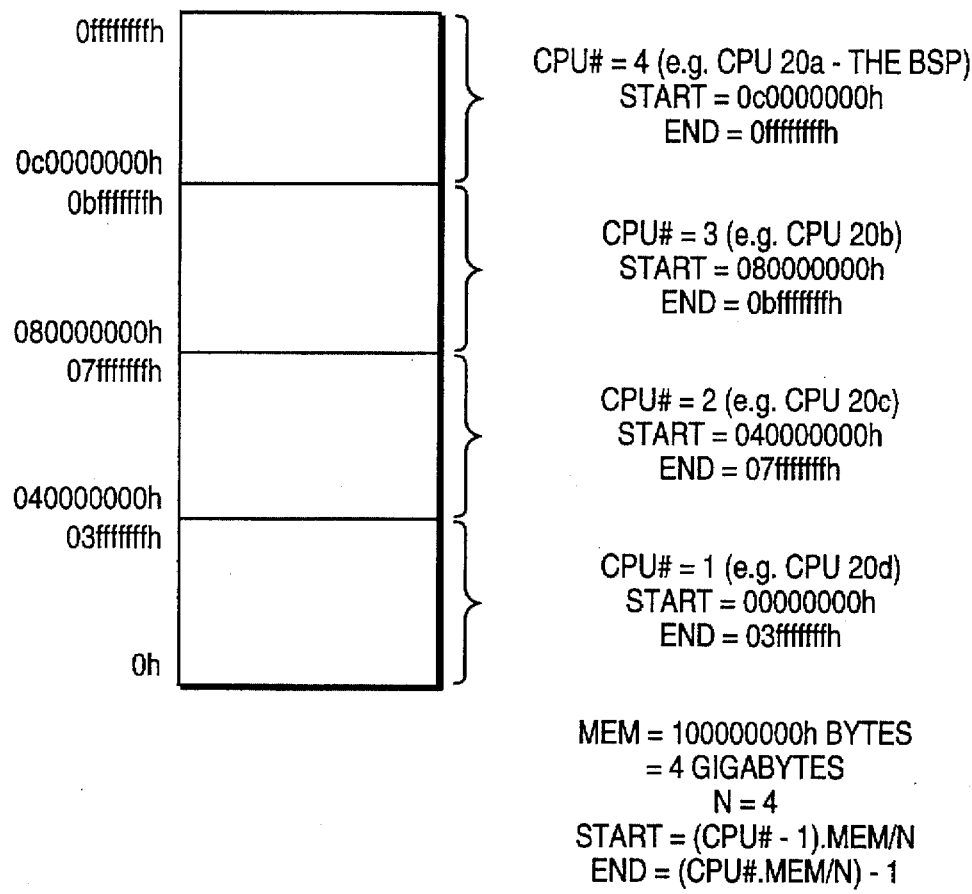
FIG. 4 is an example of partitioning of a memory map for a multiple processor computer system for memory testing according to an embodiment of the invention.

The simplest way in which to apportion the shared system memory between the microprocessors 20 for testing thereof is to allocate an equal amount of memory to each microprocessor, in contiguous blocks spanning the available system memory. FIG. 4 shows an example of a memory map for the system memory 10 of the computer system 2 shown in FIG. 1, and a way in which the memory can be allocated to the microprocessors 20 for the purposes of memory testing. In this example, the total amount of memory, as determined by the BSP during the initialization process, is four gigabytes, and the microprocessors 20D, 20C, and 20B have been allocated processor sequence numbers 1, 2, and 3 respectively.

In this instance the strategy which is employed to partition the memory and allocate the memory portions amongst the processors is according to the following equations:

starting address START=(CPU#−1).MEM/N ending address END=(CPU#.MEM/N)−1 where CPU# is the allocated processor sequence number for a processor (beginning with CPU#=1)

MEM is the total memory size

N is the total number of operative processors (including the BSP)

For example, for the case illustrated in FIG. 4, the total memory size MEM=1 0000 0000h bytes (=4 Gigabytes), the total number of processors N=4, and CPU 20b is allocated sequence number CPU#=3. Thus the starting address and ending address for the memory portion allocated for memory testing by processor 20b is determined:

START=0 8000 0000h

END=o bfff ffffh

According to this strategy the BSP is always allocated the last sequence number (i.e.: CPU# for the BSP is N) so that the BSP always tests the highest portion of system memory. The described procedure for allocating portions of memory to the various processors is only one way in which the invention may be carried out, however, and many other possibilities will be apparent to those skilled in the art. For example although the described implementation involves each processor determining its own starting and ending address on the basis of the CPU#, MEM and N data passed from the BSP, in an alternative the BSP may determine a starting address and ending address for each processor and pass that information to the other processors as well as or instead of the CPU#, MEM and N. Furthermore, it will be recognized that it is not necessary for each processor to be allocated a single continuous block of the system memory. In other words, multiple, separate blocks of memory may be allocated to processors for testing whereby multiple starting and ending addresses are determined, or some other addressing strategy is employed, for a particular processor. For example, in a computer system comprising two processors involved in memory testing, one processor could be allocated even-numbered memory addresses and the other processor odd-numbered addresses.

Various algorithms for testing memory are known to those skilled in the art, one being a simple write/read/compare procedure. In this case, a particular data value is written to a memory location, the memory location is then subsequently read, and the data read from the memory compared with the data written thereto to ensure that the data values coincide. These operations are then repeated for each memory location in the portion of memory to be tested by the microprocessor. Other more complex methods of testing the memory may alternatively be employed, as are also known in the art. In some cases, it may be advantageous to utilize some form of buffering in the microprocessor subsystems 6 so that a plurality of memory locations can be examined, in which case an internal cache memory of the microprocessor, or the level-two cache could be utilized for that purpose. As mentioned above, it is generally preferred that the level-two cache provided in processor subsystems 6 be disabled for the purposes of memory testing so as to ensure that a fault occurring in the cache does not affect the results of the memory test. Therefore, if a cache memory is to be used for buffering during a memory testing procedure, the initialization method steps which precede the memory test should include testing to ensure functionality of the cache memory.

The forgoing detailed description of an embodiment of the present invention has been put forward by way of example only, and it is not intended to be considered limiting to the invention as defined in the claims appended hereto.

What is claimed is:

1. In a multiple processor computer system, an initialization method comprising the steps of:

allocating respective portions of shared memory to each of a plurality of processors; and testing said respective portions of shared memory in each of said plurality of processors by time division multiplexed access to said shared memory.

2. The initialization method of claim 1, further comprising the step of selecting one of said plurality of processors as a bootstrap processor which performs said step of allocating respective portions of shared memory.

3. The initialization method of claim 2, further comprising the step of the bootstrap processor initializing resources essential to said step of testing said respective portions of shared memory.

4. The initialization method of claim 2, wherein said step of allocating comprises the step of said bootstrap processor communicating data values to each of the others of said plurality of processors, said data values enabling each of the others of said plurality of processors to determine a respective starting address and ending address defining one of said respective portions of shared memory.

5. The initialization method of claim 4, wherein the step of communicating data values comprises the step of determining data values enabling apportionment of said shared memory into said respective portions, said data values including the size of said shared memory, the number of said plurality of processors and a respective processor number for each of said plurality of processors.

6. The initialization method of claim 2, further comprising the step of passing data from said bootstrap processor to each of the others of said plurality of processors in succession, said data enabling each of the others of said plurality of processors to successively begin testing said respective portions of shared memory.

7. The initialization method of claim 6, further comprising the step of said bootstrap processor testing one of said respective portions of shared memory after each of the others of said plurality of processors have begun said testing step.

8. The initialization method of claim 2, further comprising the step of each of said plurality of processors setting a respective flag in a register at the conclusion of testing one of said respective portions of shared memory.

9. The initialization method of claim 2, wherein said step of allocating comprises the step of said bootstrap processor determining, for each of said plurality of processors, a starting address and an ending address defining one of said respective portions of shared memory.

10. A method as claimed in claim 2 wherein the step of selecting said bootstrap processor comprises the step of arbitrating between said plurality of processors to determine said bootstrap processor.

11. A method as claimed in claim 1, wherein said step of testing comprises the steps of:

passing time division multiplexed signals between said plurality of processors and a memory controller coupled between said plurality of processors and said shared memory; and said memory controller writing to and reading from said respective portions of shared memory in response to said time division multiplexed signals.

12. A method as claimed in claim 1, wherein the step of testing comprises the step of each of said plurality of processors communicating with a memory controller to effect writing to and subsequent reading from substantially every memory location of one of said respective portions of shared memory, said writing and reading being time division multiplexed as between said plurality of processors.

13. The initialization method of claim 1 wherein said step of testing comprises the steps of each of said plurality of processors:

(a) writing a first data value to a location in one of said respective portions of shared memory;

(b) reading a second data value from said location;

(c) comparing said first data value with said second data value; and (d) repeating steps (a) through (c) for substantially every location in said one of said respective portions of shared memory.

14. The initialization method of claim 1, wherein said step of allocating respective portions of shared memory comprises the steps of:

determining the size of said shared memory;

determining the number of said plurality of processors;

determining a respective processor number for each of said plurality of processors; and determining start and end addresses defining each of said respective portions of shared memory from the size of said shared memory, the number of said plurality of processors and the respective processor number for each of said plurality of processors.

15. A computer system comprising:

a plurality of processors coupled to a bus;

a first memory coupled to said bus;

a second memory coupled to said bus; and program instructions stored in said second memory, said program instructions executed by each of said plurality of processors to test respective portions of said first memory by time division multiplexed access to said first memory.

16. A computer system as claimed in claim 15, further comprising a memory controller coupled between said bus and said first memory, said memory controller writing to and reading from said first memory in response to time division multiplexed signals received from said plurality of processors.

17. A computer system comprising:

a plurality of processors coupled to a bus;

a first memory coupled to said bus;

a memory controller coupled between said first memory and said bus, said memory controller writing to and reading from said first memory in response to time division multiplexed signals received from said plurality of processors; and a second memory coupled to said bus containing initialization instructions, said instructions executed by said plurality of processors such that each of said plurality of processors communicates with said memory controller means to test respective portions of said first memory over substantially the same time interval.

18. A method for testing memory in a multiple processor computer system having shared memory accessible on a common bus, comprising the steps of:

assigning to each of a plurality of processors a respective separate portion of said shared memory;

each of said plurality of processors writing data to and subsequently reading data from substantially every memory location of said respective separate portion of memory, the writing and reading of said data being time division multiplexed as between said plurality of processors; and comparing in each of said plurality of processors said data written and said data read from said respective separate portion of said shared memory.

* * * * *